United States Patent [19]
Stecher et al.

[11] Patent Number: 6,057,199
[45] Date of Patent: May 2, 2000

[54] METHOD OF PRODUCING A SEMICONDUCTOR BODY

[75] Inventors: Matthias Stecher; Hermann Peri, both of Villach, Austria

[73] Assignee: Siemens Aktiengesellschaft, Munich, Germany

[21] Appl. No.: 09/022,691

[22] Filed: Feb. 12, 1998

[30] Foreign Application Priority Data

Feb. 12, 1997 [DE] Germany .......................... 197 05 351

[51] Int. Cl.$^7$ ................................. H01L 21/336
[52] U.S. Cl. ..................... 438/299; 438/306; 438/734
[58] Field of Search .................... 438/241, 254, 438/299, 306, 133, 138, 202, 268, 283, 689, 734, 751; 257/409

[56] References Cited

U.S. PATENT DOCUMENTS

| | | | |
|---|---|---|---|
| 5,057,894 | 10/1991 | Ikeda et al. | 357/43 |
| 5,573,967 | 11/1996 | Tseng | 438/254 |
| 5,710,073 | 1/1998 | Jeng et al. | 438/239 |
| 5,895,239 | 4/1999 | Jeng et al. | 438/239 |
| 5,936,273 | 8/1999 | Chen | 257/306 |

FOREIGN PATENT DOCUMENTS

4434108A1 3/1996 Germany .

OTHER PUBLICATIONS

"BiCMOS Memories: Increasing Speed While Minimizing Process Complexity", Craig Lage, Solid State Technology, Aug. 1992, pp. 31–33.

"Bauelemente der Halbleiter–Elektronik", Springer–Verlag Berlin, 1991.

*Primary Examiner*—John F. Niebling
*Assistant Examiner*—Christopher Lattin
*Attorney, Agent, or Firm*—Herbert L. Lerner; Laurence A. Greenberg; Werner H. Stemer

[57] ABSTRACT

The process produces a semiconductor body with a first region that has a self-aligning structure and with a further second region. The insulation layer lying on a semiconductor layer in the first region is fully removed in the second region using a photographic technique and a subsequent etching process. Subsequently, or at the same time, the requisite structuring of the semiconductor layer and of the insulation layer is carried out in the first region. This leads to substantially lesser topography changes and steps and thus higher packing density in the further region of the semiconductor body.

8 Claims, 3 Drawing Sheets

METHOD OF PRODUCING A SEMICONDUCTOR BODY

BACKGROUND OF THE INVENTION

Field of the Invention

The invention relates to a method of producing a semiconductor body with a first region that has a self-aligning structure, and with a remaining second region. The method includes the following process steps:

applying a first oxide layer to an upper main surface of the semiconductor body, and structuring the first oxide layer;

applying a semiconductor layer to the oxide layer; and applying an insulation layer to the semiconductor layer.

A process of this type is known, for example, from German published, non-prosecuted application DE 44 34 108 A1 (corresponding to commonly assigned U.S. application Ser. No. 08/853,158). The process describes the formation of a low-resistance contact between a metallization layer and a semiconductor material, in which insulator layers with predefined doping and an intermediate semiconductor layer are applied to the surface of the semiconductor material and are structured. Further to this, dopants of different conductivity are implanted in the semiconductor body by using the structured layers as a mask. This gives a small contact area for a given current, and a small turn-on resistance.

The so-called "self-aligning" technique is essential in that process. There, a semiconductor layer, for example heavily doped polycrystalline silicon, is used as the gate material of a MOS transistor, and is at the same time employed as a mask for doping the source and drain (cf. R. Müller: "Bauelemente der Halbleiter-Elektronik" [Semiconductor Electronics Components], Springer-Verlag, Berlin, 1991). In order to structure that semiconductor layer, an at least single-level insulator layer containing a predetermined amount of dopants, is applied to it. The insulator layer serves as a getter layer. The insulator layer may typically be a so-called TEOS which is subsequently structured using a standard photolithographic technique and etched anisotropically. Using the insulator layer as a mask, the semiconductor layer is then etched anisotropically and the desired shape of gate, for example a strip, is produced in the MOS transistor region. A dopant may then be implanted in the semiconductor body through a hole etched into the semiconductor layer.

While the prior art process is very suitable for the production of self-aligning structures in semiconductor bodies, it has been found that problems arise when both power components, for example DMOS transistors, and other components are to be integrated in the semiconductor body. The reason for this is that, in the case of power MOS transistors, for example DMOS transistors, in order to optimize the closing resistance it is necessary to employ the above-mentioned technique with a self-aligning structure which requires the superposition of a semiconductor layer and an overlying insulation layer. This insulation layer which needs to lie on the semiconductor layer is in fact about two times higher than the semiconductor layer. Since the semiconductor layer is also used, in the further region of the semiconductor body where it is not necessary to have a self-aligning structure, in order to produce interconnections, the build-up of the insulation layer on these interconnections which inevitably occurs on account of the above-mentioned production process produces comparatively high steps which further metallization planes must overcome. This entails large interconnection spacings, contact holes on the semiconductor layer, problems with fabrication and yields, and as a result high process costs.

The problem of the high steps which are due to the insulation layer which until now has unavoidably been present on the semiconductor layer, and which further metallization planes need to overcome, is illustrated with the aid of sectional views taken through a part of a semiconductor body produced according to the prior art process. FIGS. 5 to 7 show the semiconductor body in various phases of production.

FIG. 7 illustrates a detail of a finished semiconductor body of this type, in which the region with a self-aligning structure is denoted A and the further region is denoted B. A DMOS transistor is, for example, produced in the region A, while superposed metallization planes for a resistor, a diode or the like are represented summarily in the other region B.

The semiconductor body has a p-doped substrate 10 in which a so-called buried layer 12 is embedded. The buried layer 12 is in the region A. A deep diffusion area 16 which makes a conductive connection between the buried layer 12 and a first metallization layer 32 extends vertically upward from this buried layer 12. To the left of the deep diffusion area 16 there are two p-doped wells 18, only half of the well 18 represented on the left being visible. These p-doped wells 18 are connected centrally to the first metallization layer 32. To the left and to the right of the contact formed on the p-doped well 18 by the metallization layer 32, there are $n^+$-doped areas 20 which form the source of a MOS transistor. On the upper main surface of the semiconductor body configured in this way, an oxide layer 22 is disposed which is interrupted by the above-mentioned contacts formed by the metallization layer 32 on the p-doped wells 18 and the deep diffusion area 16. Above the oxide layer 22 there is a semiconductor layer 24 which, for example, may be a heavily doped polysilicon layer. The semiconductor layer 24 is interrupted by the above-mentioned contact with the metallization layer 32 in region A.

In the left-hand part of region A, this semiconductor layer 24 forms the gate electrode layer, on which there is an at least one-level further insulation layer 26. To the left and to the right of the edges of this stack of semiconductor layers 24 and 26, there are so-called spacers 30 which insulatingly cover the edges. The metallization layer 32 extends over the above-mentioned structure. Similarly, the semiconductor layer 24, with the overlying insulation layer 26, is arranged between the p-area 18 represented on the right in FIG. 7 and the deep diffusion area 16. The two-level layer formed by the semiconductor layer 24 and the insulation layer 26 rise in steps to the right.

In the second region B of the semiconductor body, there is likewise provided a structured portion of the above-mentioned semiconductor layer 24, but in this case for producing an interconnection or a resistor rather than a gate electrode. Since, as mentioned above, this semiconductor layer 24 can be structured exclusively via the overlying insulation layer 26 (cf. FIGS. 5 and 6), the latter is necessarily also present in the region B on the semiconductor layer 24. This insulation layer 26 which is necessarily present produces comparatively high steps in region B which are not absolutely necessary because there does not have to be a self-aligning structure in region B for producing MOS transistors, and spacers 30 do not therefore need to be present in this region. Nevertheless, the metallization layer 32 needs to overcome relatively high steps. In order to enable the production of a second interconnection of this type by means of the metallization layer 32 in region B, yet another insulation layer 28 needs to be applied to the semiconductor body (as shown by FIG. 4). Only then can the metallization layer 32 be applied.

For the sake of completeness, there is yet a further upper insulation layer 36 and a second metal layer 34 represented in FIG. 7.

In the fabrication of semiconductor bodies, on which both self-aligning structures and further regions are integrated, the above-mentioned high steps for the metallization layer 32 lead to considerable problems. Indeed, the high steps of the metallization layer, which may for example be an aluminum layer, lead to comparatively deep etching processes. Deep etching processes of this type are expensive and complex in terms of production. Lastly, high steps of this type in the further region of the semiconductor body rule out high packing density of integrated components.

SUMMARY OF THE INVENTION

It is accordingly an object of the invention to provide a method of producing a semiconductor body, which overcomes the above-mentioned disadvantages of the prior art devices and methods of this general type and which is improved at the start of production, in that higher packing density is achieved, and simpler production of the semiconductor body is made possible. The process is premised on the object to produce semiconductor bodies which permit comparatively small interconnection spacings, at least in the further region of the semiconductor body.

With the foregoing and other objects in view there is provided, in accordance with the invention, a method of producing a semiconductor body having a first region with a self-aligning structure, and a remaining second region, the method which comprises:

forming a first oxide layer on an upper main surface of a semiconductor body and structuring the oxide layer;

forming a semiconductor layer on the oxide layer;

forming an insulation layer on the semiconductor layer;

structuring the insulation layer photographically and with subsequent etching such that the insulation layer is fully removed from a second region and remains at least partially on the semiconductor layer in a first region; and structuring the insulation layer together with the semiconductor layer photographically and with subsequent etching.

In other words, the novel process is distiguished by the additional steps in which the insulation layer is structured using a photographic technique and subsequent etching, in such a way that it is fully removed in the second region B and at least partially remains on the semiconductor layer in the first region A, and, using a photographic technique and subsequent etching, the semiconductor layer and, in sections where the insulation layer lies over the semiconductor layer, the insulation layer together with the semiconductor layer are structured.

In accordance with an added feature of the invention, the semiconductor layer is formed as a polysilicon layer.

In accordance with an additional feature of the invention, in the first structuring step the insulation layer is at least partially removed in the first region photographically (i.e., by a photographic technique) and with subsequent etching.

In accordance with another feature of the invention, a plurality of DMOS FETs are integrated in the first region.

In accordance with a further feature of the invention, the insulation layer is formed as an insulation layer with at least two levels.

In accordance with again an added feature of the invention, the insulation layer is formed with a height at least substantially twice the height of the semiconductor layer.

In accordance with again another feature of the invention, the method comprises the following additional steps which are performed subsequently to removing the insulation layer lying on the semiconductor layer:

implanting a first dopant of a first conductivity type;

implanting a second dopant of a second conductivity type;

applying a further insulation layer surface-wide to the semiconductor body;

structuring the further insulation layer photographically and anisotropically etching down to the semiconductor surface;

anisotropically etching the semiconductor body while using the further insulation layer as a mask;

implanting a third dopant of the second conductivity type while using the further insulation layer as a mask; and depositing at least one metallization layer on the semiconductor body.

In accordance with a concomitant feature of the invention, the further insulation layer is structured to form spacers laterally adjoining edges of the semiconductor layer and the overlying insulation layer in the first region.

Other features which are considered as characteristic for the invention are set forth in the appended claims.

Although the invention is illustrated and described herein as embodied in a method of producing a semiconductor body, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
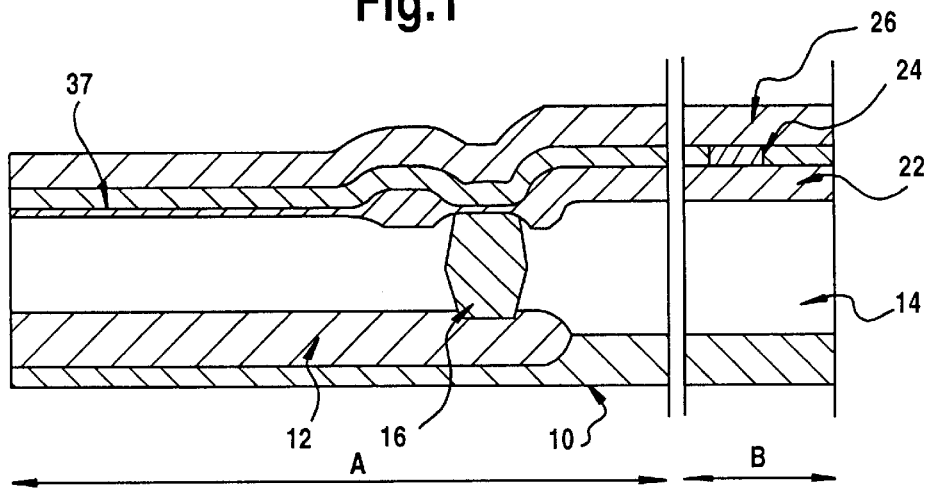
FIG. 1 is a partial sectional view taken through a semiconductor body produced with the process according to the invention, in an early process step.

Referring now to the figures of the drawing in which, unless otherwise indicated, same reference numerals denote same parts throughout, and first, particularly, to FIG. 1 thereof, there is seen a semiconductor body in which a region A with self-aligning structure and a further region B are integrated. FIG. 1 shows an early process step within the production process. The semiconductor body structure represented in FIG. 1 may, for example, be attained by process steps as described in the above-mentioned commonly assigned DE 44 34 108 A1. The disclosure of the publication and the corresponding U.S. application is herewith incorporated by reference.

The semiconductor body has a p-doped substrate 10 which extends laterally over the entire semiconductor body. In region A, a buried layer 12 is embedded in the substrate 10. Over the buried layer 12, there is an n-doped epitaxy layer divided by a deep diffusion area 16 extending vertically to the upper main surface of the semiconductor body. A well 14 is formed by means of this in region A. The well 14 later (cf. FIG. 4) supports p-doped wells 18, which do not extend as far as the buried layer 12. An insulation layer 22, here a FOX layer, is applied over the entire semiconductor body. The insulation layer 22 is structured by means of a standard photographic technique and wet chemical etching. It is possible for the oxide angle of the insulation layer 22 to be set by low-dose preimplantation or produced by means of a LOCOS process. After this, a gate oxide 37 is applied to the semiconductor body in predetermined regions.

In the next step, a semiconductor layer 24, for example a heavily doped polysilicon layer, is formed on the structured insulation layer 22 and the gate oxide layer 37. The semiconductor layer 24 is doped to high conductivity with a furnace process. From this semiconductor layer 24, future gate electrodes are produced in region A, and, for example, resistors, interconnections, magnetoresistors or further gate electrodes in region B. In the next step, a further insulation layer 26 is applied surface-wide to this semiconductor layer 24. This insulation layer 26 may be a single layer or a multiple tier layer. FIG. 1 shows the structure described so far.

The insulator layer 26 may, for example, be a TEOS layer. In a preferred embodiment, the insulator layer 26 is a double layer of a doped oxide and an undoped oxide.

Figure 2:
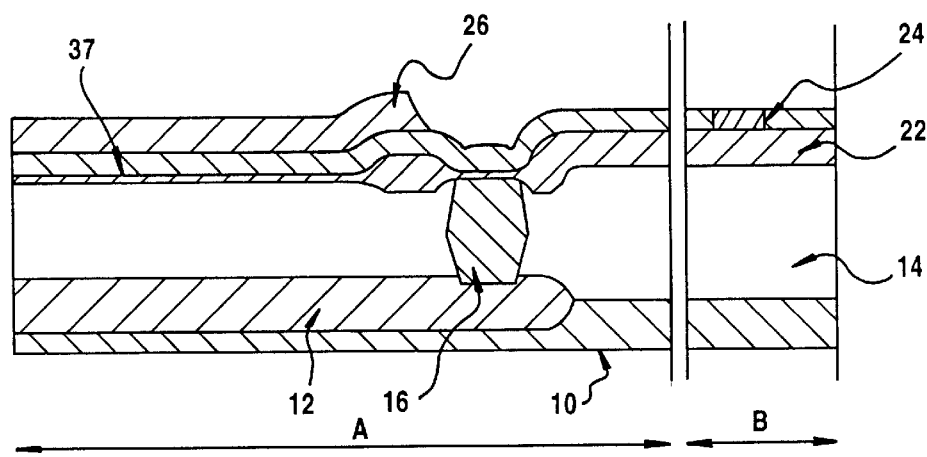
FIG. 2 is a similar view thereof, in a later process step.

As can be seen from FIG. 2, the insulation layer 26 is structured in the next process step by means of a photographic technique and subsequent etching process, in such a way that it is fully removed in region B and at least still partially remains in region A, where the self-aligning contacts are intended to be. The etching process may, for example, be carried out by wet chemical etching. In the illustrative embodiment which is represented, the insulation layer 26 is present to the left of the deep diffusion area 16, while it is etched off over the deep diffusion area 16 and to the right thereof. In this process step, it is absolutely necessary to ensure that the insulation layer 26 remains in the region of the self-aligning contacts to be produced later, that is to say where the p$^+$-doped well 18 is present later in region A (cf. FIG. 4).

Figure 3:
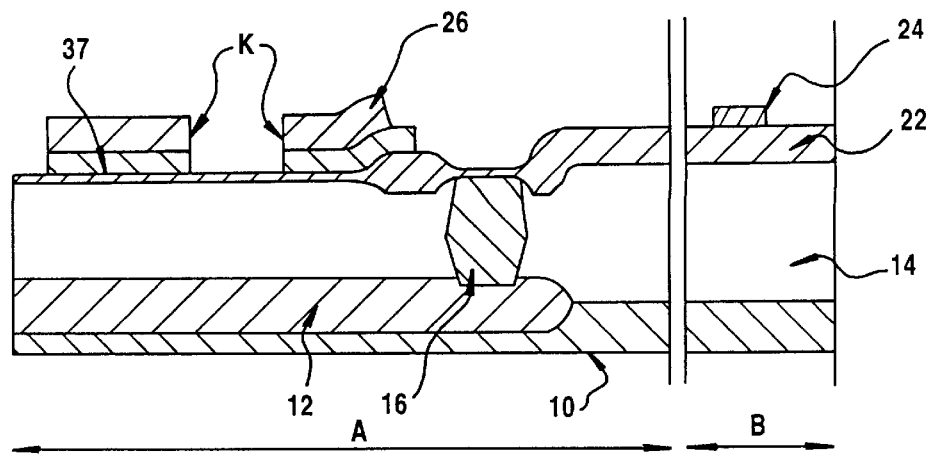
FIG. 3 is a similar view thereof, in yet a later process step.

In a process step which follows, the semiconductor layer 24 and, in sections where the insulation layer 26 still lies over the semiconductor layer 24, the insulation layer 26 together with the semiconductor layer 24, are structured in common. The semiconductor body resulting therefrom is represented in FIG. 3. The above-mentioned etching process serves in region A to etch through the insulation layer 26 and the underlying semiconductor layer 24 as far as the oxide layer 22. The edges which result therefrom, to which so-called spacers 30 are later applied (FIG. 4), are denoted K in FIG. 3. In the further regions, where there is no insulator layer 26 on the semiconductor layer 24, it is merely the semiconductor layer 24 that is structured. In region B, the structured semiconductor layer 24 may be used to produce, for example, interconnections and/or resistors.

At the above-mentioned edges K (FIG. 3), a spacer 30 is formed (FIG. 4) in a subsequent process step by applying a further oxide layer 28 using a standard photographic technique together with subsequent etching. The above-mentioned oxide layer 28, which is firstly applied or deposited surface-wide to the semiconductor body, encloses the semiconductor layer 24 in the region B as well. The semiconductor layer 24 is used in region B as an interconnection or resistor. The oxide layer 28 insulates the semiconductor layer 24 in region B from an overlying metallization layer 32.

Figure 4:
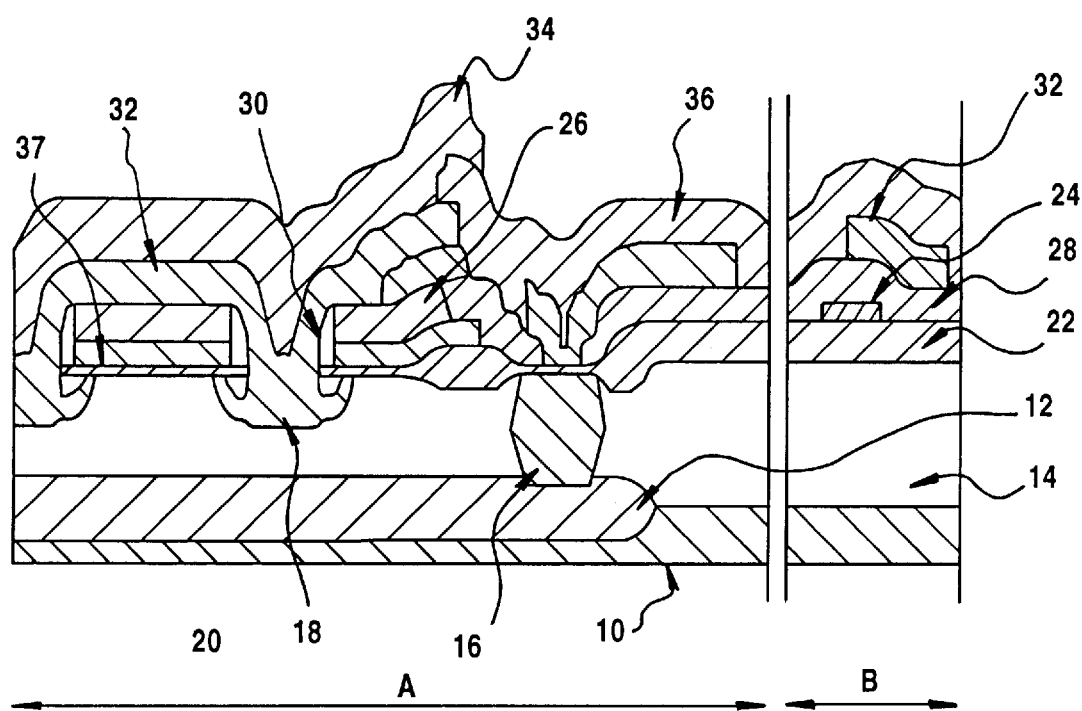
FIG. 4 is a similar view in yet an even later process step.
Figure 5:
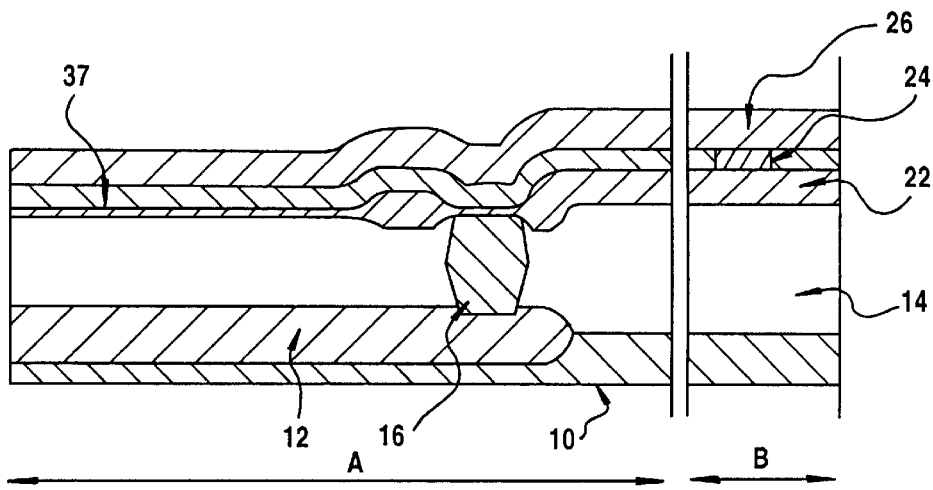
FIGS. 5–7 are sequential sectional view of a prior art semiconductor body at various stages of production.
Figure 6:
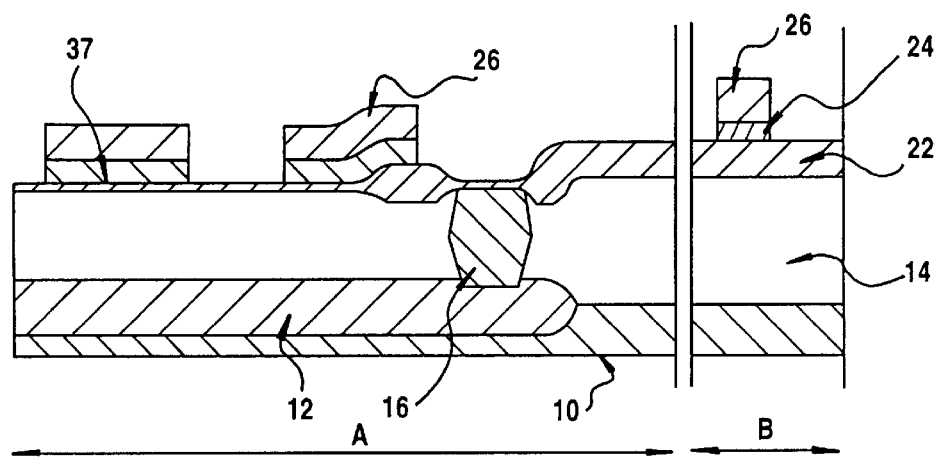

In detail, the following further steps may, for example, be carried out after the process step represented in FIG. 3, in order to form the semiconductor body shown in FIG. 4:

implanting a p-dopant to form the well 18;

implanting an n$^+$-dopant to form n$^+$ areas 20;

forming a further insulation layer 28 surface-wide to the semiconductor body;

structuring the further insulation layer 28 with a photographic technique and etching down to the semiconductor surface;

etching the semiconductor body using the further insulation layer 28 as a mask;

implanting a p$^+$-dopant of the second conductivity type using the further insulation layer 28 as a mask; and depositing at least one metallization layer 32, 34 on the semiconductor body.

Figure 7:
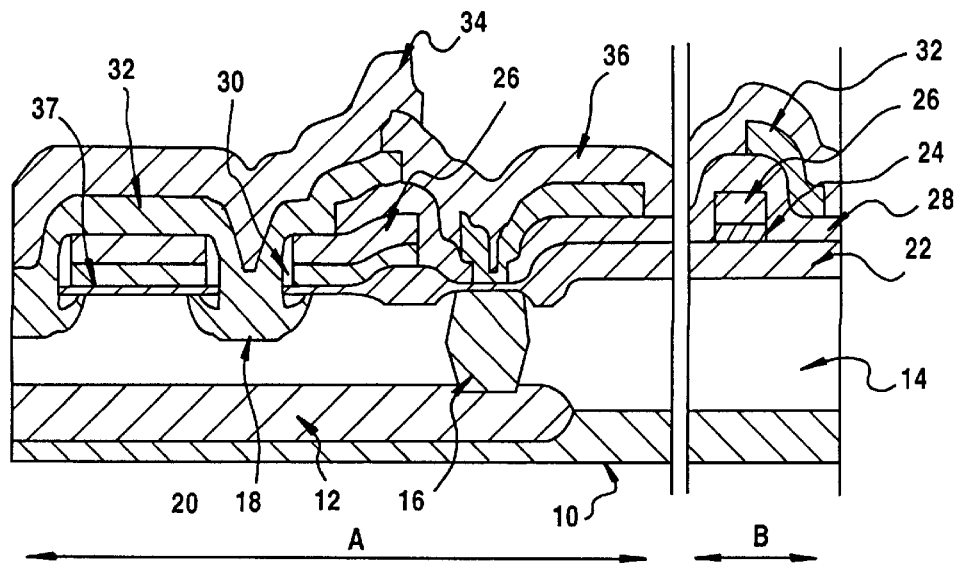

Comparing FIGS. 4 and 7 shows that, in the process according to the invention (FIG. 4), the metallization layer 32 has to overcome a considerably smaller step, and can therefore be fabricated much more easily than in the prior art process (FIG. 7). In total, this effects a higher packing density in region B of the circuit integrated in the semiconductor body.

In summary, according to the novel manufacturing process, the insulation layer 26 needed for the self-aligning technique is later removed in all parts of the semiconductor body where no self-aligning contacts are used. This does, however, require an additional mask plane and etching of the insulator layer. Nevertheless these two additional process steps lead to only a slightly higher production cost for the semiconductor body. Moreover, this slightly increased production cost permits a higher packing density for the integrated circuit as a whole.

We claim:

1. A method of producing a semiconductor body having a first region with a self-aligning structure, and a second, remaining region, the method which comprises:

forming a first oxide layer on an upper main surface of a semiconductor body and structuring the oxide layer;

forming a semiconductor layer on the oxide layer;

forming an insulation layer on the semiconductor layer;

structuring the insulation layer photolithographically and with subsequent etching such that the insulation layer is fully removed from a second region and remains at least partially on the semiconductor layer in a first region; and performing a further structuring step by structuring the insulation layer simultaneously with the semiconductor layer photolithographically and with subsequent etching.

2. The method according to claim 1, wherein the step of forming the semiconductor layer comprises forming a polysilicon layer.

3. The method according to claim 1, wherein the first recited structuring step comprises at least partially removing the insulation layer in the first region photographically and with subsequent etching.

4. The method according to claim 1, which further comprises integrating a plurality of DMOS FETs in the first region.

5. The method according to claim 1, wherein the step of forming the insulation layer comprises forming an insulation layer with at least two levels.

6. The method according to claim 1, wherein the step of forming the insulation layer comprises forming the insulation layer with a height at least substantially twice a height of the semiconductor layer.

7. The method according to claim 1, which further comprises, subsequently to removing the insulation layer lying on the semiconductor layer:

implanting a first dopant of a first conductivity type;

implanting a second dopant of a second conductivity type;

applying a further insulation layer surface-wide to the semiconductor body;

structuring the further insulation layer photographically and anisotropically etching down to the semiconductor surface;

anisotropically etching the semiconductor body while using the further insulation layer as a mask;

implanting a third dopant of the second conductivity type while using the further insulation layer as a mask; and depositing at least one metallization layer on the semiconductor body.

8. The method according to claim 1, which further comprises structuring the further insulation layer to form spacers laterally adjoining edges of the semiconductor layer and the insulation layer lying thereabove in the first region.

* * * * *